United States Patent
Girard

(10) Patent No.: US 7,046,814 B2
(45) Date of Patent: May 16, 2006

(54) IMPEDANCE ADAPTER PREAMPLIFIER DEVICE FOR ELECTRONIC TUBE AUDIO FREQUENCIES ABLE TO BE INSERTED ON LINE ON THE PATH OF THE LOW FREQUENCY SIGNAL

(76) Inventor: Nicolas Girard, 31 Rue de Croulebarbe, 75013 Paris (FR)

( * ) Notice: Subject to any disclaimer, the term of this patent is extended or adjusted under 35 U.S.C. 154(b) by 776 days.

(21) Appl. No.: 10/099,563

(22) Filed: Mar. 15, 2002

(65) Prior Publication Data
US 2002/0172380 A1    Nov. 21, 2002

Related U.S. Application Data

(63) Continuation of application No. PCT/FR00/02552, filed on Sep. 14, 2000.

(30) Foreign Application Priority Data
Sep. 15, 1999    (FR) ................................. 99 11524

(51) Int. Cl.
H03F 21/00    (2006.01)
(52) U.S. Cl. .................................................... 381/120
(58) Field of Classification Search ................ 381/120; 330/49, 276, 53
See application file for complete search history.

(56) References Cited

U.S. PATENT DOCUMENTS

| | | | |
|---|---|---|---|
| 2,918,630 A | 12/1959 | Kiebert | 330/119 |
| 2,965,853 A | 12/1960 | MacDonald | 330/91 |
| 3,743,954 A | 7/1973 | Snedkerud | 330/10 |
| 4,092,608 A * | 5/1978 | Woods | 330/10 |
| 4,673,888 A | 6/1987 | Engelmann et al. | 330/10 |
| 5,343,159 A | 8/1994 | Butler | 330/3 |
| 5,526,253 A * | 6/1996 | Duley | 363/59 |
| 5,550,509 A * | 8/1996 | Trentino | 330/127 |
| 5,612,646 A * | 3/1997 | Berning | 330/10 |
| 5,834,977 A | 11/1998 | Machara et al. | 330/297 |
| 6,140,870 A * | 10/2000 | Cook | 330/3 |

FOREIGN PATENT DOCUMENTS

EP    0862260    9/1998

* cited by examiner

Primary Examiner—Brian T. Pendleton
(74) Attorney, Agent, or Firm—Ladas and Parry LLP

(57) ABSTRACT

The invention concerns an online low frequency amplifying interface operating in automatic cutting feed, particularly designed for multimedia computers. It concerns a impedance adapting device produced around an electronic tube. It can be arranged between a source transmitting low frequency signals and a receiver. The invention is characterised in that it comprises an low frequency amplifier sub-part having high impedance at the source whereto it is connected, and having a low impedance at the receiver whereto it is connected next. The high voltage power supply of the anodes of the low frequency device is produced by a working high frequency automatic cutting feed regulator feeding a voltage amplifying device. The automatic cutting feed regulator operates in direct current low voltage. The inventive device is particularly designed for sound boards and for sources of hi-fi installations, whether incorporated or not.

20 Claims, 4 Drawing Sheets

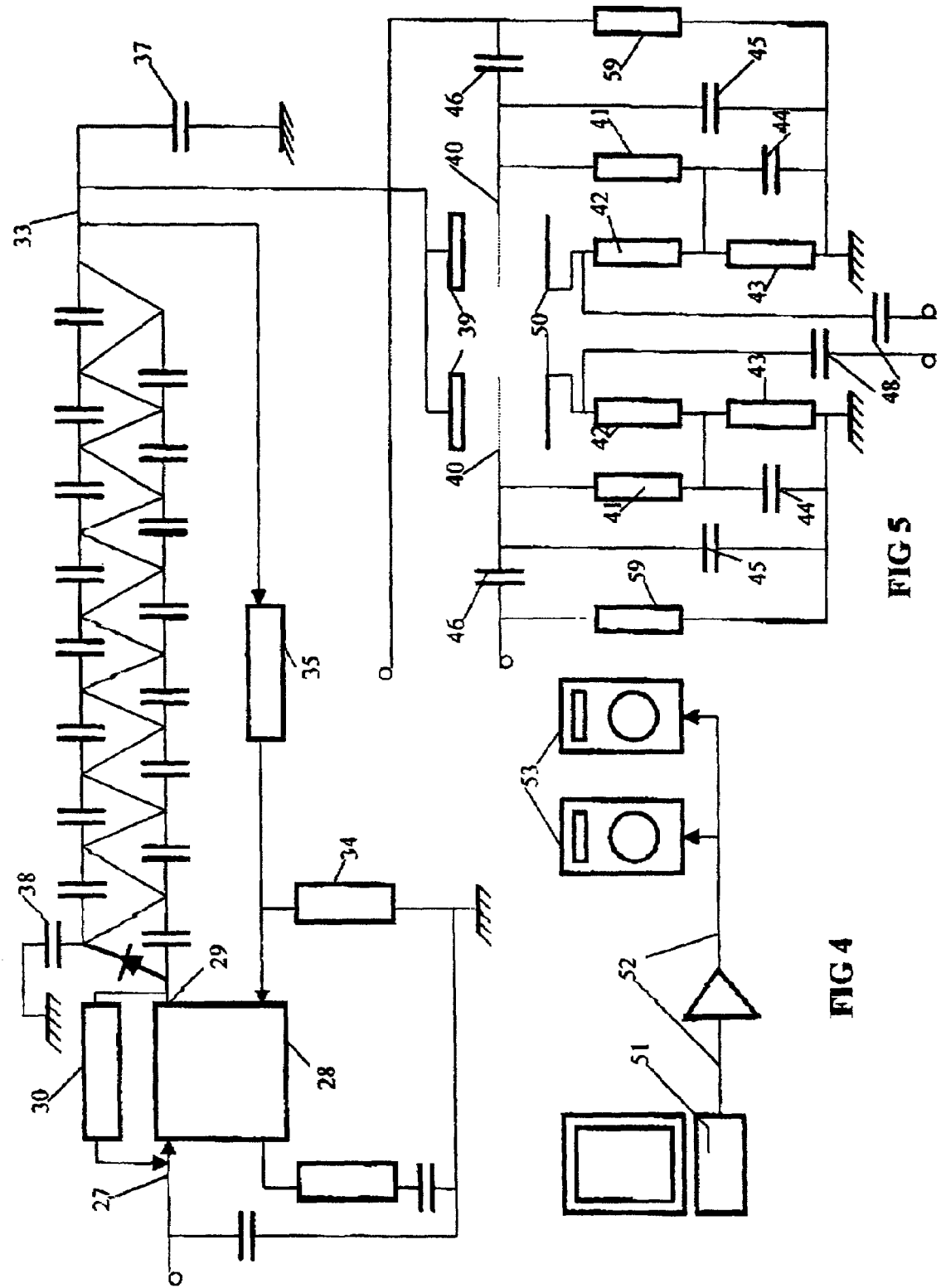

IMPEDANCE ADAPTER PREAMPLIFIER DEVICE FOR ELECTRONIC TUBE AUDIO FREQUENCIES ABLE TO BE INSERTED ON LINE ON THE PATH OF THE LOW FREQUENCY SIGNAL

This application is a continuation International Application PCT/FR00/02552 filed on 14 Sep. 2000, which designated the U.S., claims the benefit thereof and incorporates the same by reference.

The invention concerns an impedance adapter amplifier device for electronic tube audiofrequencies able to be inserted on line on the path of the low frequency signal.

In low frequency electronics, the impedance adaptation is known to be currently effected having no special interface between the various chain links of the signal processing chain, In fact, in the majority of cases, the impedance of the outgoing stage of the "transmitter" and the impedance of the incoming stage of the "receiver" are equal, a token of the improved power transmission theory but to the detriment of the auditory results which are generally qualified as mediocre by music-lovers.

At the current moment, the chains for processing the low frequency signal, such as recording studios, control room installations (possibly mobile), sound pick-up devices, "monitoring loops", high fidelity control installations, home high fidelity installations and those inside vehicles (land, air and sea vehicles), "Home cinema" high fidelity installations, high-fidelity installations derived from computers all these multimedia installations, (that is those including an audio output and speakers or operator consoles) are prone to the problems of impedance adaptation described above, these being that more significant when these "low frequency signal processing chains" are composed of active chain links, all connected in most cases by extremely large cable lengths generating a highly sensitive reduction in the quality level of the low frequency signal to be processed by the presence of "insertion losses" and "stray capacities" which are more significant when the cables connecting the various elements of these "signal processing chains" are long.

Moreover in all these cases where a specific impedance adapting device is highly welcomed, the most frequently encountered problem concerns spatial requirement. Most of the "line amps" are large and normally need to he mounted inside a technical cabinet.

In low frequency electronics applied to audio, it is also known that the quality of the mains voltage greatly influences the quality of the processed low frequency signal. It is also known that electronic tubes require a high operating voltage, namely several hundreds of volts and under relatively weak currents. At the current moment, a high d.c. voltage required for the to function can be provided by a feed booster/rectifier/voltage filter device. This traditionally concerns a device using a transformer, a diode bridge and a capacitor fed by the a.c. voltage of the EDF network—at a frequency of 50 hertz). Now because the complete filtering of the residual ripple after rectification of the a.c. voltage of the mains supply is impossible, this results in "pollution" of the high d.c. voltage generally applied to the anodes of electronic tubes by the superposition of a residual ripple at a frequency of 100 hertz. This is derived from the mains voltage. As a result, this residual ripple is mostly found on the low frequency audio signal processed by the amplifier device fed by the previously described feed device. Also, there is a tendency of the devices for rectifying/filtering mains voltages, which are generally composed of resistive and capacitive elements, to limit the aptitude of the devices for processing the audio signal they feed to be reproduced without causing distortion and attenuations of bass frequencies on account of their high output impedance.

Finally, in the case of computers and in particular audio/video multimedia stations, the low frequency signal is first of all digital-coded and then analog-decoded by a unit commonly known as a "sound card". In this unit, the outgoing stage of the "sound card" towards the other chain links of the signal processing chain, which is generally effected around an operational amplifier provides extremely poor listening quality expressed by a "dry" and rather disagreeable musicality for the human ear owing in particular to the fact that certain harmonic groups with uneven dominant notes are favoured.

The object of the invention is to mitigate said drawbacks.

To this effect, the invention concerns an electronic tube amplifier for amplifying audio signals circulating on a transmission line connecting a transmission device to at least one receiving device, the device being inserted on the line between the transmission device and the receiving device, characterised in that it includes an electronic tube amplifier module with a high input impedance and a weak output impedance coupled to a voltage booster stage fed by a cut-off regulator module whose frequency is greater than and outside the frequency band of the audio signal The elements of the amplifier device are preferably composed of the electronic tube amplifier module, the voltage booster stage and the cut-off regulator module all being incorporated in a given box.

The invention also concerns a computer sound card comprising a mother card, characterised in that it includes an electronic tube amplifier module having a high input impedance and a low output impedance and a voltage booster stage coupled to a cut-off regulator module (8), also placed on the sound card and whose frequency is greater than and outside the frequency band of the audio signal, and in that the input and output of the amplifier module are coupled to an analog communication bus, in that the input of the amplifier is also coupled to the output of an analog/digital converter so as to convert into analog signals the digital signals provided by the mother card of the computer, and in that the output of the amplifier module is also coupled to a digital/analog converter so as to provide the mother card of the computer with the signals obtained at the output of the preamplifier in a digital form.

The main advantage of the device of the invention is that it makes it possible to adapt the impedance between the "transmitter" and "receiver" by having at the "transmitter" an extremely high impedance of more than 10 mego-ohms, and by having at the "receiver" an extremely low impedance of a hundred ohms, thus bringing the output impedance/input impedance ratio to a value currently greater than 100,000.

Another advantage is that it can be fed by a high voltage originating form a cut-off regulator feeding a voltage booster assembly, such as a load pump or transformer, and functioning at a frequency higher than the upper limit of the audible spectrum, it escapes the problem of pollution of the audio signal in the audible portion of the spectrum and the problem of the inability to reproduce low frequencies. In fact, in the case of the device described in the invention, as the fundamental frequency of the residual ripple is more than the limit of the audible spectrum of an average person, no sensitive pollution can be heard by the human ear within the audible band of the spectrum, that is between 20 hertz and 20000 hertz. Furthermore, the output impedance of the high frequency feeding is extremely low with respect to its low frequency counterpart.

Secondly, by being fed by a small cut-off power supply, the device of the invention can be placed in a box the size of a packet of cigarettes, the input of the low frequency audio signal being effected at one of the extremities of the box fitted at the "audio input" and the output being effected at the other fitted at the "audio output". Later, it is also possible to integrate the power supply inside the same speaker as the one encompassing the electrodes of the amplifier tube. Thus, the device is provided so as to be placed on line on the path of the signal which requires neither any special fixed installation nor being placed in a rack.

The device of the invention can also be added in series and/or replace the output stages of the sound cards of computers by embodying impedance adaptation, up until now generally effected by semi-conductive devices, possibly integrated, by means of an electronic tube device, a component familiar to amateur music-lovers, for its capacity to favour certain groups of harmonics with even dominant notes giving "listening" a sensation of opening, softness and airing of the musical message belonging to tube electronic devices.

Other characteristics and advantages of the invention shall appear from a reading of the following description with reference to the accompanying drawings, namely:

FIGS. 3 and 4 show an embodiment for coupling the device of the invention to an audio frequencies transmission chain.

FIG. 5 shows a detailed embodiment of a device according to the invention.

Figure 1:
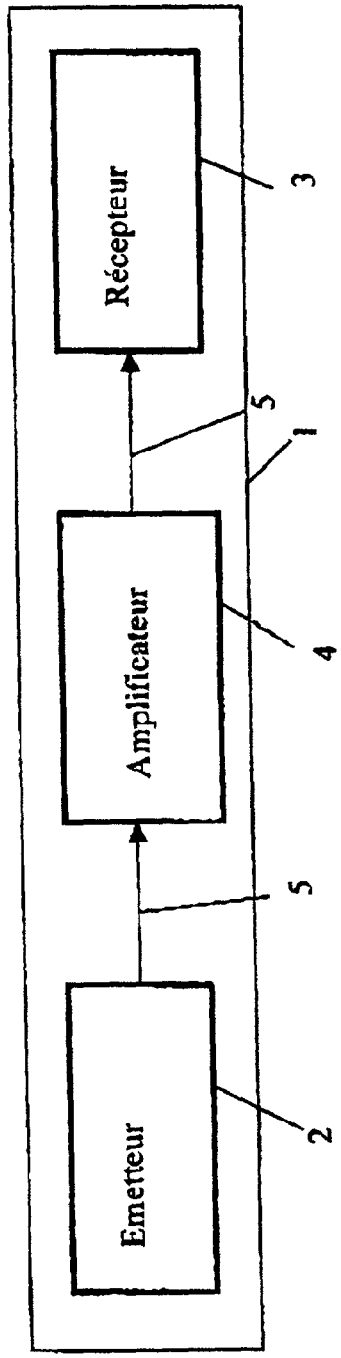
FIG. 1 shows a chain for processing an audio signal 5 incorporating a device according to the invention.

In the synoptic diagram FIG. 1, this shows in a general way the chain (1) for processing the low frequency audio analog signal currently encountered in the various applications to be described hereafter. The "transmitter" (2) represents any variable output impedance analog source or low frequencies interface in which or from which low frequency signals transit or are transmitted, either for example by a compact disk reader, a digital audio cassette reader (DAT), an analog mini-disk reader and analog cassette reader, a vinyl plate, a computer sound card, a mixing console, an audio effect device, a compression device, a recording microphone, a "live box", an autoradio handset, . . . the receiver (3) similarly denoting any intermediate audio chain link with variable input impedance receiving or being traversed by a low frequency signal derived from a source transmitter: it can also come from a low frequency power amplifier, a preamplifier, a "live box", a computer or console amplified speaker, a mixing table, the input of a computer sound acquisition card. The reference (5) denotes the cabled links connecting the various analog chain links of the low frequency signal processing chain. The device (4) of the invention is inserted on line on the path of the low frequency audio signal between the "transmitter" and the "receiver".

Figure 2:
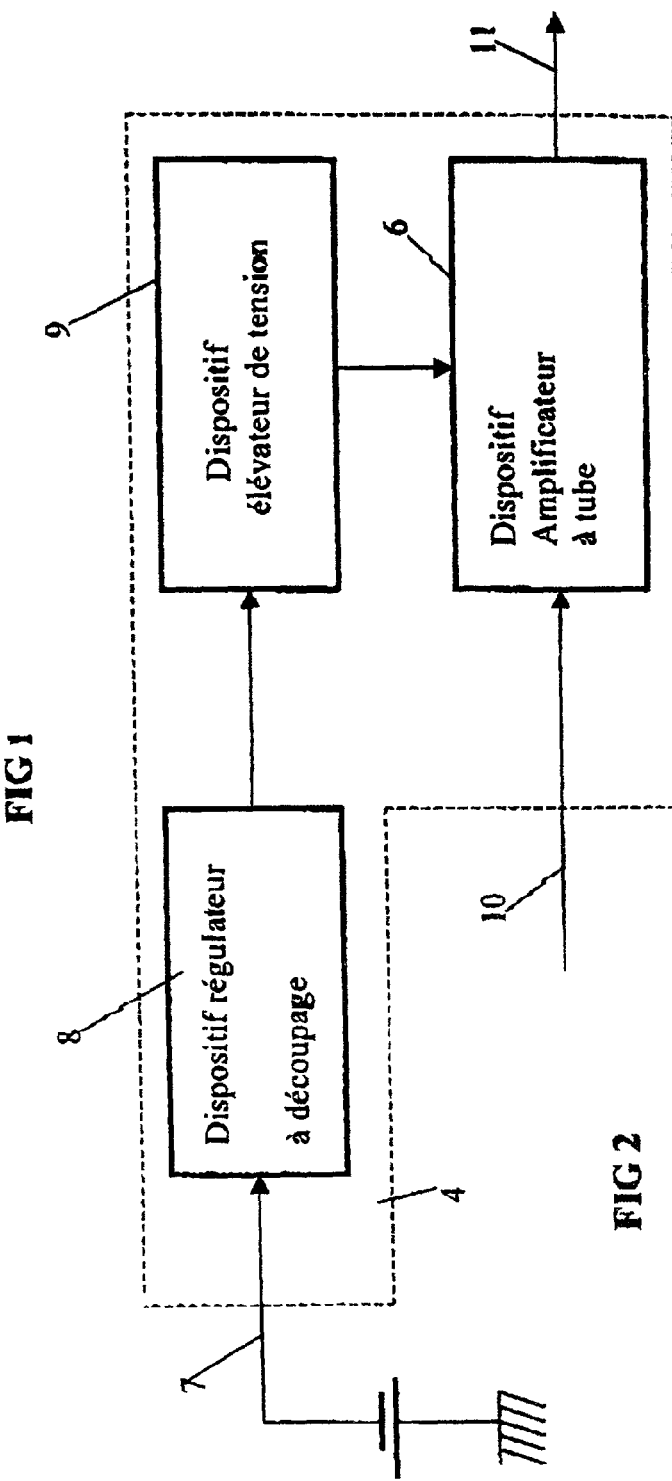
FIG. 2 is a simplified diagram of an embodiment of a device according to the invention.

The synoptic of FIG. 2 shows the various sub-units constituting the invention. An electronic tube amplifier device (6) is fed with high d.c. voltage produced via the application of a low d.c. voltage (7) to an integrated high functioning frequency cut-off regulation device (8) feeding a voltage booster device (9). In this particular embodiment, the low frequency audio signal is applied at the input of the amplifier device (10) on the grid of the electronic tube situated inside the device (6) and then "comes out" once amplification has been effected by mounting, namely by the cathode of the vacuum tube (11).

As the device is fed by a high voltage derived from the cut-off regulator (8) feeding the voltage booster stage (8) like a charge pump or transformer and functioning at a frequency of at least 25 times the upper limit of the audible spectrum (namely 25×20 kilohertz=500 kilohertz), this avoids the problem of pollution of the audio signal in the audible portion of the spectrum and that of the reproduction incapacity of the low frequencies. In fact, in the case of the device described in this invention as the fundamental frequency of the residual ripple is situated at 500 kilohertz, the human ear does not detect any perceptible pollution within the audible hand of the spectrum, that is between 20 hertz and 20000 hertz, hence a perceptible increase of the dynamics of the processed signal of the lessening of the level of noise of several decibels.

Figure 3:
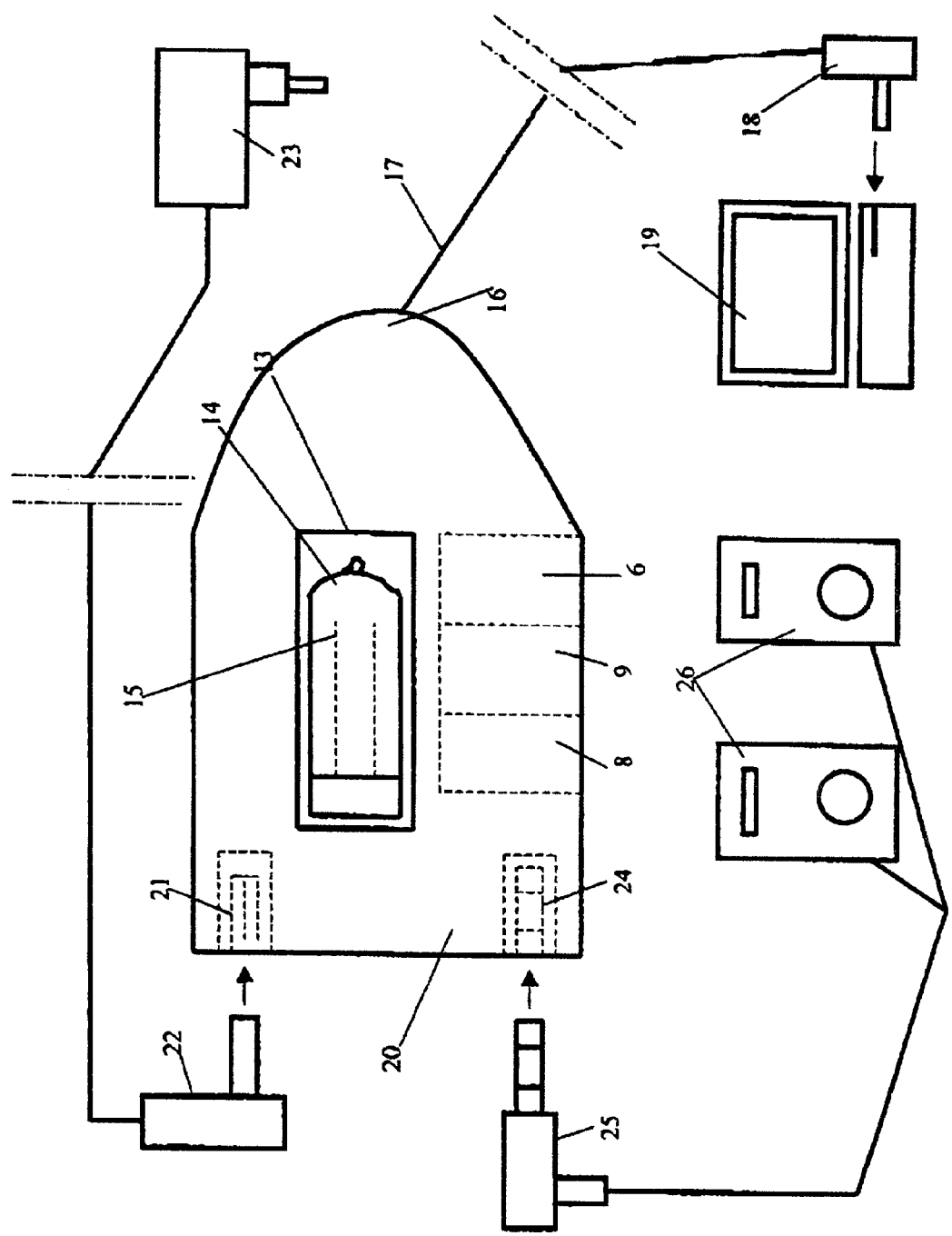

So as to better explain the utility and functioning of the invention, a particular embodiment intended for audio/video data processing stations is described below:

According to the particular embodiment described on FIG. 3, the cut-off regulator device (8), the voltage booster device (9) and the audio amplifier device (6) are placed in a small box (12). One portion of this box is hollowed (13) so as to allow the electronic tube (14) to appear allowing filtering of the reddish glare of the filaments (15). The extremity (16) of the box (12) is extended by an armoured cable (17) with two connectors in this particular embodiment, possibly detachable via a connector at the extremity of which located is a "stereo jack" type connector (18) in said particular embodiment and intended to be connected to the audio outputs of computers (19): this concerns the output (11) of the audio amplifying device of the invention. At the extremity (20) of the device of the invention, a bipolar connector (21) is placed for receiving the movable connector (22) originating from a voltage lowering device (23) able to be connected to the mains in this particular embodiment and serving as a voltage source: this concerns the device feeding the device of the invention. Situated at the extremity (20) is a stereophonic connector (24), namely the output of the audio amplifying device described according to the invention. A movable "stereophonic jack" connector (25) in this particular embodiment is connected to said stereophonic connector (24). This jack (25) links the output ((24) of the system of the invention to the acoustic control speakers (26) located next to it.

There now follows a description of the functioning of the feed mounting of FIG. 5. The low mains voltage originating from the lowering device (23) is applied to the pin (27) of the integrated cut-off regulator (28), a high-frequency switched voltage is generated by the internal oscillator of the regulator (28) and is available on the pin (29). The self-inducting coil (30) stores the current. The voltage available at (29) is then applied to an external voltage booster device (32), in this particular embodiment a voltage multiplying charge pump composed of a switching/capacitor diode. This voltage multiplying device can also be replaced by a transformer or by mounting with an equivalent function, possibly a transistor, supporting high voltages. At the outlet of the charge pump (37), a capacitor (37) fixes the potential of the newly-raised high voltage and a dividing bridge constituted by resistors (35) and (35) brings one portion of the output voltage of the booster device back onto a negative feedback pin (36) of the cut-off regulator (28), thus fixing the switched voltage available at the output of the first diode (31) at its maximum which needs to be several volts higher than the mains voltage applied at (27). A capacitor (38) stabilises the potential available on the cathode of the first diode of the booster device at the point (31). The potential of the high voltage of several hundreds of volts is stabilised at the output of the voltage booster device by the capacitor (37). The high voltage available at (33) is applied in this particular embodiment at (39) to the anodes of the electronic tubes constituting the device for processing the low-frequency audio signal.

The functioning of the portion (FIG. 5) for processing the audio signal is described in the paragraph below. In this particular embodiment, it concerns a cathodic tracker made from twin-triode electronic tubes. From the static point of view, the high voltage of several hundreds of volts is applied to the anodes (39) of the electronic tubes. The grids (40) of the electronic tubes are polarised according to the embodiment recommendations specific to the type of tubes used. Said polarisation with respect to the cathodes (41) is carried by means of resistors (41), (42), (43). The capacitors (44) and (45) eliminate a slight residual "noise" of the cut-off able to be detected with an oscilloscope. The input capacitor (46), in series on the path of the low-frequency signal insulates the chain link connected at (47) from the d.c. voltage present on the grid at (40). The resistor (59) positions the input of the mounting with respect to the earth. The capacitor (48) insulates the devices connected to the output of the mounting (49) of the high voltage present on the cathodes (50). As an alternative, the functioning of the device, namely the cathodic tracker in this particular embodiment, is as follows: the low-frequencies audio signal able to be assimilated to an a.c. voltage is applied at the input (47) where it traverses the capacitor (46), allowed as an alternative, so as to generate potential variations on the grid (40) of the electronic tube. The modulation of the grid potential generates a variation of the cathodic current. The signal having undergone current-amplification is drawn on the cathode (50) by means of the capacitor (48). The reinforcement at the lowest potential of the capacitor (48) is connected to the output (24) of the device (FIG. 3) according to a particular application of the invention. This concerns the audio output of the amplifier device. FIG. 4 shows the place occupied by the previously described device of the invention where it is inserted in a chain for processing the low frequency audio signal and constituted by a computer (51), cables (52) and a pair of amplified speakers (53). The low frequency audio signal derived from the "sound card" of the computer is intended to modulate the amplified speakers. It traverses the device which according to the invention has at the "transmitter", that is the "sound card" of the computer an extremely high input impedance and has at the "receiver", that is the acoustic speakers in this particular embodiment, an extremely low output impedance. It is to be noted that the device of the invention could also be able to be inserted between an acquisition device, such as a microphone, and the input stage of the "sound card".

Figure 6:
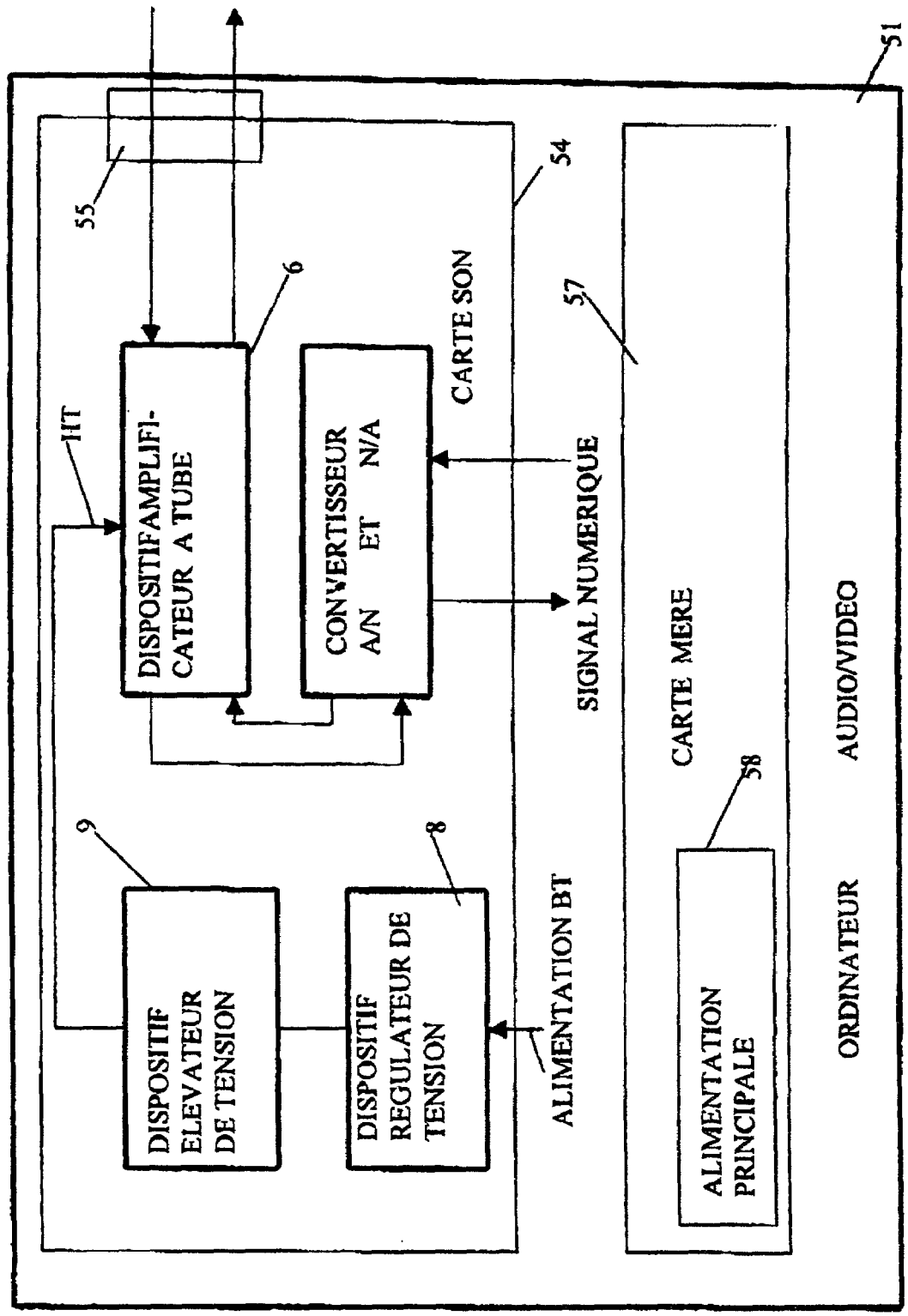
FIG. 6 shows an example of the application of a device according to the invention to the embodiment of a sound card of a computer.

According to another particular embodiment, the device of the invention can be integrated with "sound cards" of computers provided with audio/video interfaces. The diagram shown on FIG. 6 represents the flowchart of various sub-units of the device to be described in the following lines. The portion of the audio/video (51) of the computer denoted as a "sound card" (54) is a sub-unit intended via a communication bus (55) to allow the acquisition and restoration by the computer of analog data, such as low frequency audio signals in the device concerning us. "Sound cards" allow communication from the outside world to the inside of the computer and vice versa. The sub-unit (56) is a reversible digital/analog and analog/digital converter. In one direction from the inside of the mother card (57) of the computer holding the "sound card" (54) to the outside world a function for converting into analog signals digital magnitudes coding intensity variations according to the frequency, namely characteristics of the processed low frequency signals. In the other direction, its unction is to code into digital signals the analog low frequency audio signals derived from miscellaneous acquisition devices.

The device (6) is the electronic tube amplifier sub-unit which processes the audio signal originating from the converter device (56). As the amplifier device (6) is the last device traversed by the low frequency audio signal, it is called the "output stage of the sound card". The anodes of the electronic tubes composing the amplifier device (6) are fed by a high voltage of several hundreds of volts originating from the voltage booster device (9) fed by the cut-off regulator represented at (8). The cut-off regulator can unrestrictedly be fed by a d.c. low voltage or not taken from the main power supply (58) of the host computer (53). Functioning from the point of view of processing of the audio signal of the system represented on FIG. 6 is as follows. During an acquisition process, the analog low frequency audio signal is applied to the sound card (54) via the bus (55). It attacks the impedance adapter tube amplifier device (6) "integrated with the sound card". Once amplified by (6), the signal is coded into digital by the converter (56). Once in digital format, it is then processed by the mother card of the host computer. During a restoration process, the digital audio signal is first of all converted into a low frequency audio signal by the converter (56). The signal is then amplified by the device of the invention (6) and then is available in an analog form at the output of the sound card, that is on the bus (55).

Another application specific to motor vehicles is briefly described in the following lines. In fact, in land vehicles the cable lengths pose sensitive impedance adaptation problems. The extensive lengths of modulation cables inherent in mobile audio installations no longer constitute a handicap regardless of the localisation of the chain links of the reproduction chain. Upstream, the extremely high input impedance of the device of invention enables the source ("compact disk" reder) to be expressed more freely, as if it were functioning without any charge.

Downstream, its output low impedance enable it to attack with "current" an amplifier even further away. Moreover, in the application described here, it advantageously replaces the output stage of any converter by substituting in particular its digital attenuator for a motorised analog potentiometer. The device of the invention functions by being fed by the battery of the vehicle.

The invention is not merely limited to the embodiments described above and on the other hand other embodiment variants are also possible. For example, according to one first embodiment variant, the cut-off feed and the voltage booster device associated with it can also both be integrated in a pellet receiving the broaching of the amplifier tube and being plugged into a tube support piece by being inserted between the broaching of the tube and the support piece. In this case, it could be advantageous to use the supply voltage of the filament of the tube as a feed voltage of the cut-off feed.

According to a second embodiment, the cut-off feed and voltage booster devices could be integrated in the speaker surrounding the electrodes of the tube.

The invention claimed is:

1. Electronic tube amplifier device for amplifying audio signals circulating on a transmission line connecting a transmission device (2) to at least one receiving device (3), the device being inserted on the line between the transmission device (2) and the receiving device (3), characterised in that it includes an electronic tube amplifier module (6) with high input impedance and low output impedance coupled to a voltage booster stage (9) fed by a cutoff regulator module (8) whose frequency is greater than and outside the frequency band of the audio signal, wherein the electronic tube amplifier module (6), the voltage booster stage (9) and the cutoff regulator module (8) are incorporated in a given box (12).

2. Device according to claim 1, characterised in that the voltage booster device (9) is a transformer.

3. Device according to claim 1, characterised in that the voltage booster device is a high voltage transistor.

4. Device according to claim 1, characterised in that the voltage booster device is a charge pump circuit.

5. Device according to claim 1, characterised in that the frequency of the cutoff regulator module (8) is greater than 500 kHz.

6. Device according to claim 1, characterised in that the cut-off regulator module (8) and the voltage booster stage (9) are integrated in a pellet receiving the broaching of the tube of the amplifier module and being plugged into a tube support piece on being inserted between the broaching of the tube and the support piece.

7. Device according to claim 1, characterised in that the cut-off regulator module (8) and the voltage booster stage (9) are integrated inside the speaker of the tube composing the amplifier module (6).

8. Device according to claim 1, characterised in that the electronic tube amplifier module (6) is formed by a tracker cathode stage.

9. Device according to claim 8, characterised in that the tracker cathode stage (6) is formed by two tracker cathode triodes, and in that the audio signal is applied between the two grids (40) of the triodes and is taken after having been amplified by the two triodes between the two cathodes (41) of the two triodes.

10. Device according to claim 9, characterised in that the tracker cathode stage is formed by a single tube with double triodes.

11. Device according to claim 1, characterised in that the voltage booster device (9) provides a stabilised voltage relatively to a d.c. reference supply voltage (7) applied to the input of the cut-off regulator module (8).

12. Device according to claim 11, characterised in that the voltage provided by the voltage booster device is applied to the anodes (39) of the triodes.

13. Device according to claim 11, characterised in that the reference d.c. supply voltage is provided by the transmission device.

14. Device according to claim 11, characterised in that the reference d.c. mains voltage is provided by a voltage reducing device (23) connected to the mains supply.

15. Computer sound card comprising a mother card (57), characterised in that it includes an amplifier module with an electronic tube (6) with a high input impedance and a low output impedance, and a voltage booster stage (9) coupled to a cut-off regulator module (8) also placed on the sound card and whose frequency is greater than and outside the frequency band of the audio signal, and in that the input and output of the amplifier module (6) are coupled to an analog communication bus (55), in that the input of the amplifier module (6) is also coupled to the output of an analog/digital converter (56) so as to convert into analog signals the digital signals proved by the mother card (57) of the computer, and in that the output of the amplifier module (6) is also coupled to an analog/digital converter (56) so as to provide the mother cards (57) of the computer with the signals obtained at the output of the amplifier module (6) in a digital form.

16. Electronic tube amplifier device for amplifying audio signals circulating on a transmission line connecting a transmission device (2) to at least one receiving device (3), the device being inserted on the line between the transmission device (2) and the receiving device (3), characterised in that it includes an electronic tube amplifier module (6) with high input impedance and low output impedance coupled to a voltage booster stage (9) fed by a cutoff regulator module (8) whose frequency is greater than and outside the frequency band of the audio signal, wherein the frequency of the cutoff regulator module (8) is greater than 50 kHz.

17. Electronic tube amplifier device for amplifying audio signals circulating on a transmission line connecting a transmission device (2) to at least one receiving device (3), the device being inserted on the line between the transmission device (2) and the receiving device (3), characterised in that it includes an electronic tube amplifier module (6) with high input impedance and low output impedance coupled to a voltage booster stage (9) fed by a cutoff regulator module (8) whose frequency is greater than and outside the frequency band of the audio signal, wherein the cut-off regulator module (8) and the voltage booster stage (9) are integrated in a pellet receiving the broaching of the tube of the amplifier module and being plugged into a tube support piece on being inserted between the broaching of the tube and the support piece.

18. Device according to claim 17, wherein the frequency of the cutoff regulator module (8) is greater than 500 kHz.

19. Electronic tube amplifier device for amplifying audio signals circulating on a transmission line connecting a transmission device (2) to at least one receiving device (3), the device being inserted on the line between the transmission device (2) and the receiving device (3), characterised in that it includes an electronic tube amplifier module (6) with high input impedance and low output impedance coupled to a voltage booster stage (9) fed by a cutoff regulator module (8) whose frequency is greater than and outside the frequency band of the audio signal, wherein the cut-off regulator module (8) and the voltage booster stage (9) are integrated inside the speaker of the tube composing the amplifier module (6).

20. Device according to claim 19, wherein the frequency of the cutoff regulator module (8) is greater than 500 kHz.

* * * * *